United States Patent
Fung et al.

(10) Patent No.: US 11,437,238 B2
(45) Date of Patent: Sep. 6, 2022

(54) PATTERNING SCHEME TO IMPROVE EUV RESIST AND HARD MASK SELECTIVITY

(71) Applicant: Applied Materials, Inc., Santa Clara, CA (US)

(72) Inventors: Nancy Fung, Livermore, CA (US); Chi-I Lang, Cupertino, CA (US); Ho-yung David Hwang, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 204 days.

(21) Appl. No.: 16/504,646

(22) Filed: Jul. 8, 2019

(65) Prior Publication Data

US 2020/0013620 A1    Jan. 9, 2020

Related U.S. Application Data

(60) Provisional application No. 62/695,745, filed on Jul. 9, 2018.

(51) Int. Cl.
*H01L 21/033* (2006.01)
*H01L 21/02* (2006.01)
*H01L 21/311* (2006.01)

(52) U.S. Cl.
CPC ...... *H01L 21/0337* (2013.01); *H01L 21/0206* (2013.01); *H01L 21/0332* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 7,745,328 B2 | 6/2010 | Yim et al. | |
| 8,748,322 B1 | 6/2014 | Fung et al. | |
| 9,837,284 B2 | 12/2017 | Chen et al. | |
| 9,881,805 B2 | 1/2018 | Li et al. | |
| 9,887,096 B2 | 2/2018 | Park | |
| 9,911,582 B2 | 3/2018 | Wu et al. | |
| 9,991,118 B2 | 6/2018 | Kwon et al. | |
| 10,658,180 B1* | 5/2020 | Mignot | G03F 7/40 |
| 2007/0259524 A1 | 11/2007 | Lee et al. | |
| 2008/0017992 A1 | 1/2008 | Kito et al. | |
| 2010/0327412 A1 | 12/2010 | Lee et al. | |
| 2011/0079918 A1 | 4/2011 | Zhou et al. | |
| 2011/0162674 A1 | 7/2011 | Tang et al. | |
| 2014/0110373 A1 | 4/2014 | Nishimura et al. | |
| 2017/0229325 A1 | 8/2017 | Lubomirsky et al. | |
| 2019/0096748 A1* | 3/2019 | Kuo | H01L 21/768 |
| 2020/0124972 A1* | 4/2020 | Meli Thompson | G03F 7/094 |

FOREIGN PATENT DOCUMENTS

KR    20080085280 A    9/2008

OTHER PUBLICATIONS

PCT International Search Report and Written Opinion in PCT/US2019/040931 dated Oct. 25, 2019, 12 pages.

* cited by examiner

*Primary Examiner* — Kathleen Duda
(74) *Attorney, Agent, or Firm* — Servilla Whitney LLC (57) ABSTRACT

Methods and film stacks for extreme ultraviolet (EUV) lithography are described. The film stack comprises a substrate with a hard mask, bottom layer, middle layer and photoresist. Etching of the photoresist is highly selective to the middle layer and a modification of the middle layer allows for a highly selective etch relative to the bottom layer.

18 Claims, 7 Drawing Sheets

PATTERNING SCHEME TO IMPROVE EUV RESIST AND HARD MASK SELECTIVITY

CROSS-REFERENCE TO RELATED APPLICATIONS

This application claims priority to U.S. Provisional Application No. 62/695,745, filed Jul. 9, 2018, the entire disclosure of which is hereby incorporated by reference herein.

TECHNICAL FIELD

The present disclosure relates generally to patterning methods with high material layer selectivity. In particular, the disclosure relates to methods to improve the selectivity of extreme ultraviolet (EUV) resists and hard mask underlayers for patterning applications.

BACKGROUND

Photolithography employs photoresists, which are photosensitive films, for transfer of negative or positive images onto a substrate, e.g., a semiconductor wafer. Subsequent to coating a substrate with a photoresist, the coated substrate is exposed to a source of activating radiation, which causes a chemical transformation in the exposed areas of the surface. The photo-resist coated substrate is then treated with a developer solution to dissolve or otherwise remove either the radiation-exposed or unexposed areas of the coated substrate, depending on the type of photoresist employed.

Lithographic techniques for creation of features having sizes of thirty nanometers or less, however, suffer from a number of shortcomings. For example, line width variations of a resist film produced by such techniques can be too large to be acceptable in view of tightening dimensional tolerances typically required in this range, e.g., tolerances of the order of the scales of the molecular components of the resist film. Such linewidth variations may be classified as line edge roughness (LER) and/or line width roughness (LWR).

Line edge roughness and line width roughness reflect linewidth fluctuations that may lead to variations in device characteristics. As critical dimensions for integrated circuits continued to shrink, linewidth fluctuations will play an increasingly significant role in critical dimensions (CD) error budget for lithography. Several suspected sources of LER and LWR in resist patterns include the reticle quality, the aerial image quality, and resist material properties.

Extreme ultraviolet (EUV) lithography (EUVL) shows promise as a next generation lithography technique. The use of EUV resists simplifies patterning processes, requiring fewer masks than a traditional 193i process. However, EUV throughput is slower and has lower etch selectivity than the traditional 193i process. The thickness of the EUV resist should be about 100-250 Å. For an EUV resist scheme to work effectively, the middle layer (ML) etch process should be highly selective relative to the photoresist. Current ML processes use fluorine chemistry that has about a 1:1 selectivity, or rely on a polymer dump to achieve higher selectivity. In a polymer dump process, the LER and LWR increase and shrink the spatial critical dimensions. Therefore, there is a need for improved materials, film stacks and/or methods of patterning a substrate with increased etch selectivity.

SUMMARY

One or more embodiments of the disclosure are directed to methods of etching a substrate. A substrate with a film stack thereon is provided. The film stack comprises a bottom layer on a hard mask, a middle layer on the bottom layer and a patterned photoresist on the middle layer. The middle layer is etched through the photoresist to form a patterned middle layer and expose portions of the bottom layer. The middle layer is etched selective over the photoresist. The substrate is exposed to a reactant to convert the patterned middle layer to a modified patterned middle layer. The bottom layer is etched through the modified patterned middle layer to form a patterned bottom layer and expose portions of the substrate. The bottom layer is selectively etched over the modified patterned middle layer.

Additional embodiments of the disclosure are directed to EUV patterning methods. A substrate comprising a substrate structure and a hard mask structure is provided. The substrate structure comprises a low-k dielectric with a metal hard mask formed thereon. The hard mask structure comprises a bottom layer formed on the metal hard mask, a middle layer formed on the bottom layer and a photoresist formed on the middle layer. The bottom layer comprises a diamond-like carbon material. The photoresist is patterned using EUV radiation and a developer to expose portions of the middle layer and leave a residue of the photoresist. The photoresist residue is removed by exposing the substrate to a plasma comprising one or more of $O_2$, $N_2$, $H_2$ or HBr. The middle layer is selectively etched relative to the photoresist to expose portions of the bottom layer and form a patterned middle layer. The patterned photoresist is removed. The patterned middle layer is exposed to an oxidizing agent to convert the patterned middle layer to a modified patterned middle layer. The oxidizing agent comprises an inductively coupled $O_2$ plasma. The bottom layer is selectively etched relative to the modified patterned middle layer to expose portions of the metal hard mask and form a patterned bottom layer. The modified patterned middle layer is removed. The metal hard mask is etched relative to the patterned bottom layer to expose portions of the low-k dielectric and form a patterned hard mask. The patterned bottom layer is removed. The low-k dielectric is etched through the patterned hard mask and the patterned hard mask is removed.

Further embodiments of the disclosure are directed to film stacks for EUV patterning. The film stacks comprise a low-k dielectric with a hard mask on the low-k dielectric. The hard mask comprises one or more of TiN or WC and has a thickness less than or equal to about 200 Å. An optional layer comprising silicon oxide having a thickness less than or equal to about 200 Å is on the hard mask. A bottom layer is on the optional layer or the hard mask. The bottom layer comprises a diamond like carbon having a thickness less than or equal to about 300 Å. A middle layer is on the bottom layer. The middle layer has a thickness less than or equal to about 200 Å and comprises one or more of a bottom anti-reflective coating (BARC), dielectric anti-reflective coating (DARC), organic BARC or doped silicon. A patterned photoresist is on the middle layer. The patterned photoresist comprises an organic resist having a thickness less than or equal to about 280 Å or a metal oxide photoresist with a thickness less than or equal to about 130 Å.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used herein, "extreme UV", "EUV", or the like, refers to radiation in the approximate range of 10 nm to 124 nm. In some embodiments, EUV radiation (also referred to as EUV light) in the range of 10 nm to 15 nm. In one or more embodiments, EUV light at a wavelength of about 13.5 nm is employed.

Some embodiments of the disclosure advantageously provide patterning schemes involved conversion of middle layer from one material to another to achieve high selectivity in ML opening relative to the resist material. Some embodiments of the disclosure advantageously provide methods of modifying a middle layer to increase etch selectivity relative to a bottom layer. Some embodiments advantageously provide patterning schemes using one material (e.g., Si or B) for a middle layer to achieve high selectivity to EUV resist. After the middle layer has been opened, the middle layer can be converted to another material (e.g., SiO or BO) to achieve high selectivity to a bottom layer. In some embodiments, the conversion of the middle layer (e.g., Si to SiO) enables the middle layer to be removed by wet etch (if applicable).

Current middle layers use silicon oxynitride (SiON) type films which do not significantly change composition during etch processes. Some embodiments of the disclosure advantageously provide middle layers of amorphous silicon (a-Si) which can be converted to silicon oxide (SiO) increasing selectivity of the middle layer to the bottom layer during a BL openings process. In some embodiments, the a-Si is highly etch selective (>10:1) relative to the photoresist during middle layer etch and after conversion to SiO becomes highly etch selective relative to the bottom layer during bottom layer etch. In some embodiments, the low density a-Si enhances the conversion to silicon oxide by increasing the oxygen penetration within the film.

Some embodiments of the disclosure provide middle layers comprising one or more of silicon, amorphous silicon, doped amorphous silicon, boron or doped boron. A chlorine ($Cl_2$) chemical etch can be used for the ML open that has higher selectivity to EUV photoresist (versus fluorine chemistry) without significant critical dimension (CD) chamber or polymer formation. The a-Si film can be porous with a relatively low density that allows for a higher etch rate. However, low density films are not ideal masks for the bottom layer, especially for high-aspect ratio (HAR) etch where high bias potential is applied. To increase selectivity, some embodiments convert the porous film to an oxide film (e.g., a-Si to SiO). The converted oxide film may have a higher density and achieve higher selectivity to the underlayer (e.g., carbon).

Figure 1:
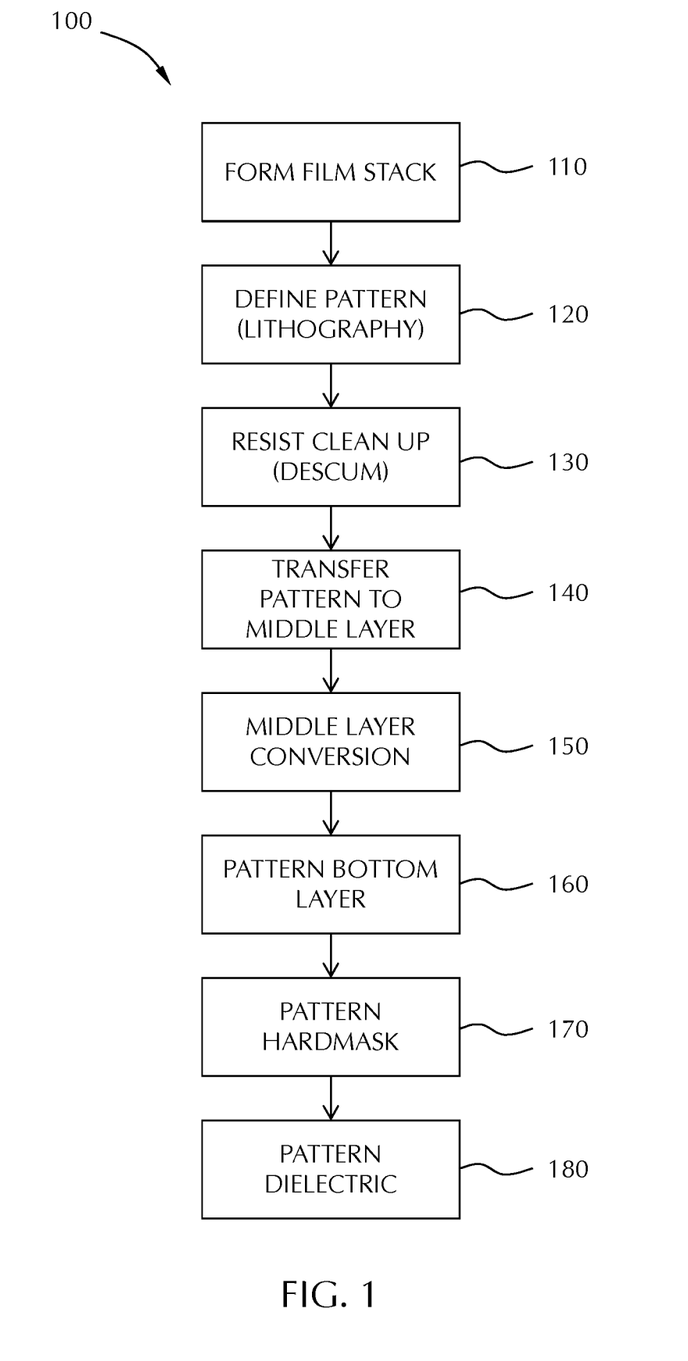
FIG. 1 depicts a flowchart of a method in accordance with one or more embodiment of the disclosure.
Figure 2A:
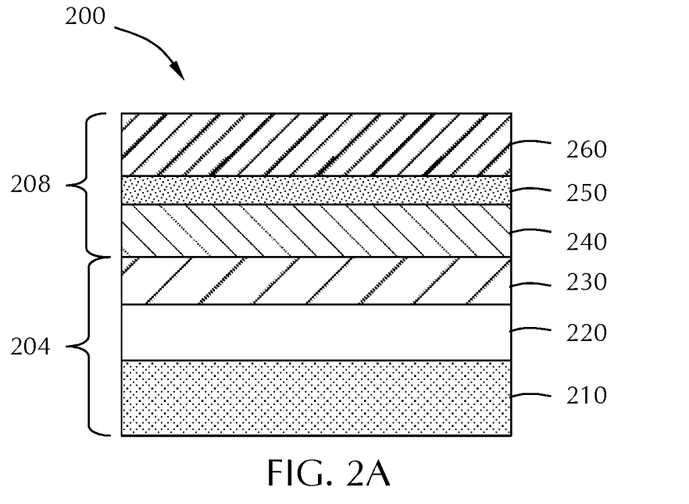
FIGS. 2A through 2N illustrated schematic representations of the method of FIG. 1.
Figure 2B:
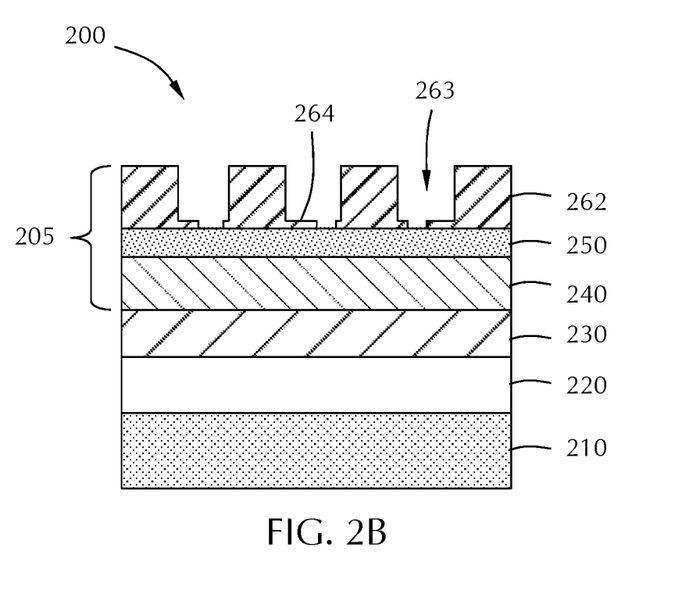
Figure 2C:
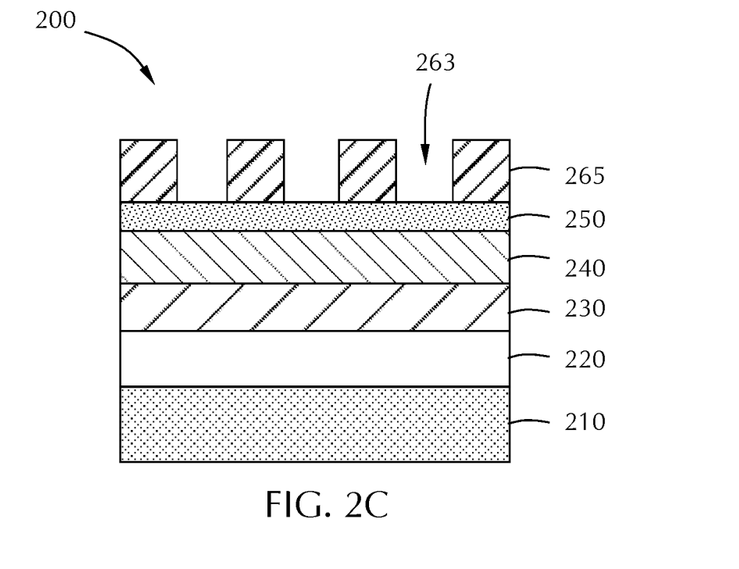
Figure 2D:
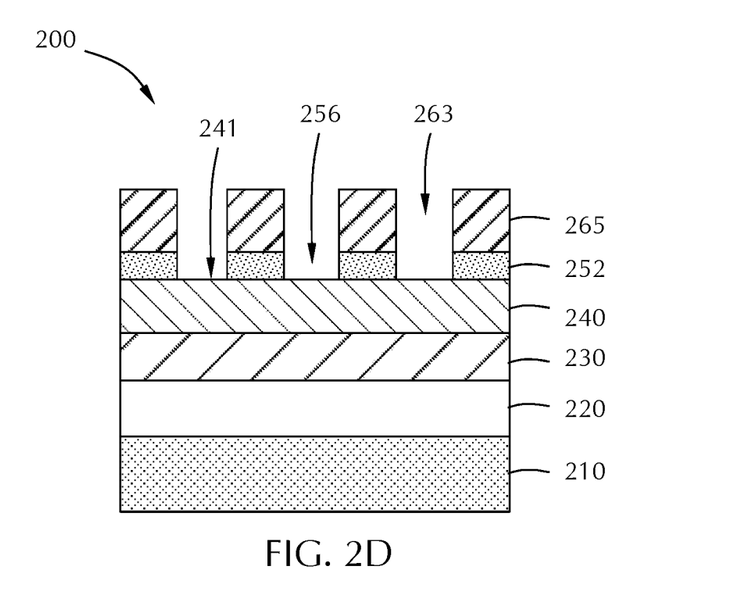
Figure 2E:
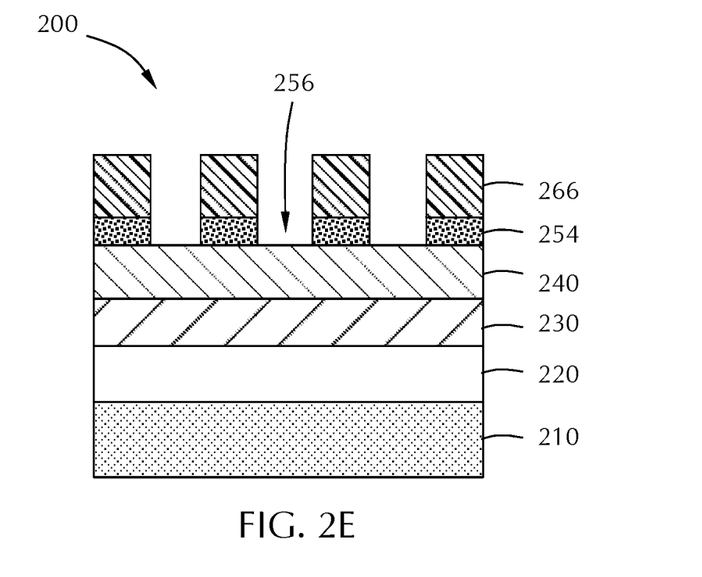
Figure 2F:
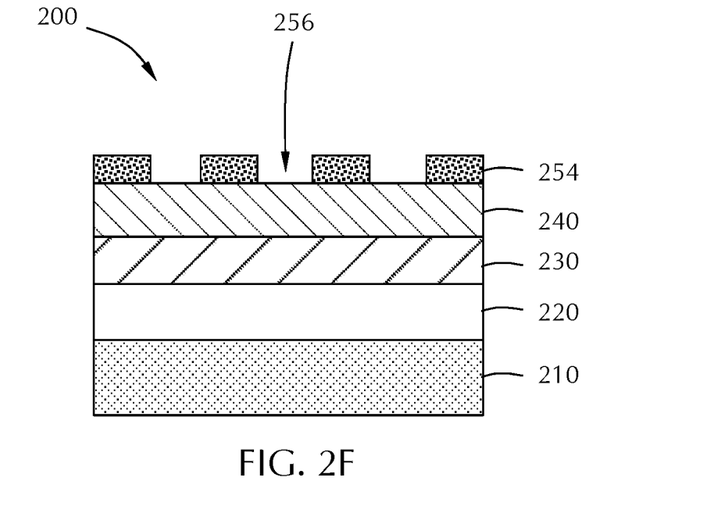
Figure 2G:
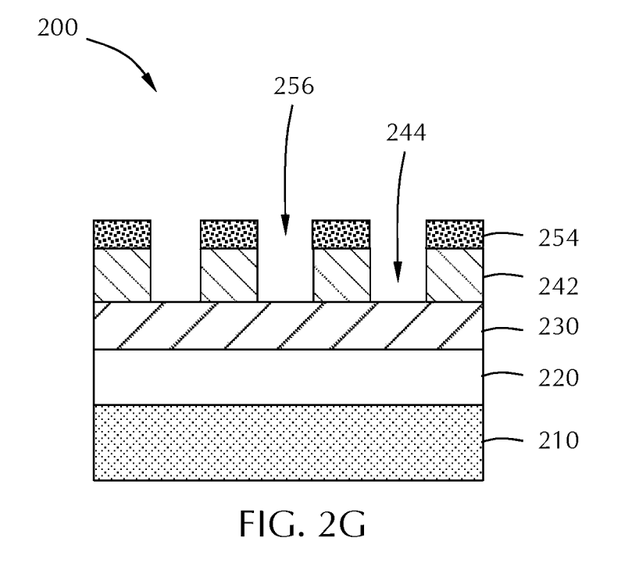

FIG. 1 illustrates an exemplary method 100 for patterning a substrate. FIGS. 2A through 2N illustrated schematic cross-sectional views of a film stack 200 during a substrate patterning process in accordance with the method 100 of FIG. 1. At 110, a film stack 200 is formed. The film stack 200 illustrated in FIG. 2A is separated, for descriptive purposes only, into a substrate structure 204 and a hard mask structure 208. The hard mask structure 208 comprises a photoresist 260 (PR), a middle layer 250 (ML) and a bottom layer 240 (BL).

As will be discussed below, the substrate structure 204 can be made up of multiple layers with the bottom-most layer being the target of the patterning application. The bottom-most layer of some embodiments is a (low-k) dielectric layer 210, and may also be referred to as the substrate. In this regard, the substrate structure 204 illustrated comprises the dielectric layer 210, a hard mask 220 and an optional layer 230. While the film stack 200 illustrated has the dielectric layer 210 as the bottom-most layer, the skilled artisan will recognize that there can be one or more additional films or layers which the dielectric layer 210 is formed upon.

Figure 2H:
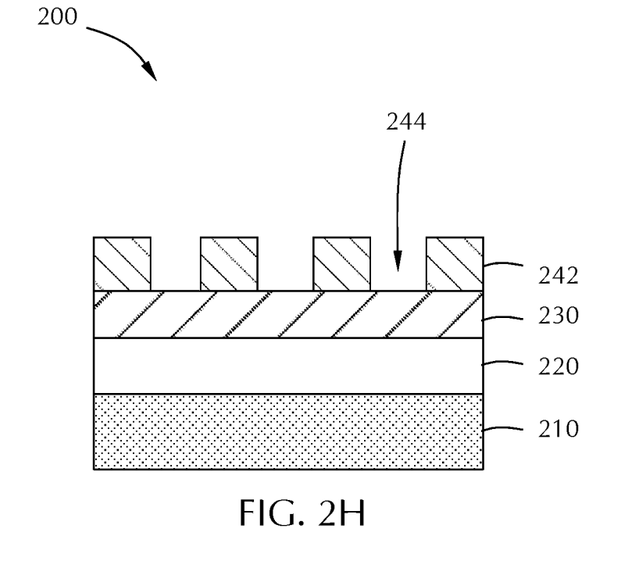

The method 100 illustrated begins with formation of the film stack 200 and moves through individual processes/sub-processes to form a patterned substrate (a patterned dielectric layer 212, shown in FIG. 2H). However, the skilled artisan will recognize that the method can include some of the illustrated processes, all of the illustrated process or additional un-illustrated processes.

At 120, and shown in FIG. 2B, a pattern is defined in the photoresist 260. This may also be referred to as patterning the photoresist 260 or forming a patterned photoresist 262. Patterning the photoresist 260 can be done by any suitable lithography process known to the skilled artisan. In some embodiments, patterning the photoresist 260 comprises exposing the photoresist 260 to a patterned EUV radiation source and a developer. The developer can remove a portion of the photoresist to expose portions of the middle layer. In some embodiments, the photoresist 260 is a negative tone photoresist and the developer removes portions of the photoresist 260 not exposed to the radiation source. In some embodiments, the photoresist 260 is a positive tone photoresist and the developer removes portions of the photoresist 260 that have been exposed to the radiation source.

The photoresist 260 of some embodiments comprise one or more of an organic photoresist or a metal oxide photoresist. In some embodiments, the organic resist comprises an organic photoresist, also referred to as a chemically amplified resist (CAR). The organic photoresist can have a thickness less than or equal to about 280 Å. In some embodiments, the organic photoresist has a thickness less than or equal to about 270 Å, 260 Å, 250 Å, 240 Å, 230 Å, 220 Å, 210 Å or 200 Å. In some embodiments, the organic photoresist has a thickness in the range of about 190 Å to about 280 Å, or in the range of about 200 Å to about 270 Å, or in the range of about 210 Å to about 260 Å, or in the range of about 220 Å to about 250 Å.

In some embodiments, the photoresist 260 comprises a metal oxide photoresist. In some embodiments, the metal oxide comprises a metal atom and one or more of carbon (C), hydrogen (H), oxygen (O) or nitrogen (N). In some embodiments, the metal oxide photoresist has a thickness less than or equal to about 130 Å, 120 Å, 110 Å, 100 Å, 90 Å or 80 Å. In some embodiments, the metal oxide photoresist has a thickness in the range of about 70 Å to about 130 Å, or in the range of about 80 Å to about 120 Å, or in the range of about 90 Å to about 110 Å, or about 100 Å.

In some embodiments, patterning the photoresist 260 forms a patterned photoresist 262 with openings 263. A residue 264 may be left in the openings 263 or in the patterned photoresist 262. At 130, the residue 264 is removed in a cleaning process to form patterned photoresist 265. The residue 264 may be colloquially known as "scum" and the cleaning process referred to as "descumming". The patterned photoresist 262 in FIG. 2B illustrates residue 264. The patterned photoresist 265 illustrated in FIG. 2C is after the cleaning process so that the residue 264 has been removed.

Removing the residue 264 can be done by any suitable process. In some embodiments, removing the residue 264 from the photoresist comprises exposing the film stack 200 to a plasma comprising one or more of HBr, oxygen gas ($O_2$), nitrogen gas ($N_2$), hydrogen gas ($H_2$), argon (Ar) or helium (He).

At 140, the pattern formed in the patterned photoresist 262 is transferred to the middle layer 250 to form a patterned middle layer 252. The patterned middle layer 252 has openings 256 and expose portions 241 of the bottom layer 240, as shown in FIG. 2D. This process is also referred to as middle layer (ML) opening. The middle layer 250 is patterned by selectively etching the middle layer 250 over the patterned photoresist 262. As used in this specification and the appended claims, phrases like "selectively etching the middle layer over the patterned photoresist", and the like, means that the first layer (i.e., middle layer in this example) is etched at a faster rate than the second layer (i.e., patterned photoresist in this example). The skilled artisan will recognize that this phrase does not imply a physical orientation of the layers; rather, a relative etch rate is described. Stated another way, the middle layer 250 is patterned by selectively etching the middle layer 250 relative to the patterned photoresist 262.

The middle layer 250 of some embodiments comprises a material with good adhesion to the photoresist 260 and the bottom layer 240. In some embodiments, the middle layer 250 comprises a material that reduces or eliminates the formation of residue 264 during patterning of the photoresist 260. In some embodiments, the middle layer 250 comprises one or more of a bottom anti-reflective coating (BARC), a dielectric anti-reflective coating (DARC), organic BARC (e.g., having an organic base), a doped silicon (e.g., phosphorus doped silicon) or a doped boron film. In some embodiments, the middle layer 250 comprises one or more of silicon or boron. In some embodiments, the middle layer 250 is substantially amorphous. In one or more embodiments, the middle layer 250 consists essentially of amorphous silicon (a-Si). As used in this manner, the term "consists essentially of" means that the subject film is greater than or equal to about 90%, 95%, 98%, 99% or 99.5% of the stated material. In some embodiments, the middle layer 250 consists essentially of boron.

The thickness of the middle layer 250 can be varied. In some embodiments, the middle layer 250 has a thickness less than or equal to about 200 Å, 190 Å, 180 Å, 170 Å or 160 Å.

In some embodiments, the middle layer 250 is etched by exposing the film stack 200 to an etchant comprising or consisting essentially of a chlorine-based etchant.

At 150, as shown in FIG. 2E, the patterned middle layer 252 is exposed to a reactant to convert the patterned middle layer 252 to a modified patterned middle layer 254. In some embodiments, the modified patterned middle layer 254 comprises an oxide of the material of the patterned middle layer 252. In some embodiments, modifying the patterned middle layer 252 increases the etch selectivity of the patterned middle layer 252 relative to the bottom layer 240.

In the illustrated embodiment, the patterned photoresist 262 is also converted to a modified patterned photoresist 266 (e.g., an oxide of the photoresist material). In some embodiments, the reactant removes the patterned photoresist 264 in the same process as forming the modified patterned middle layer 254. The patterned photoresist 264 can be removed before or during formation of the modified patterned middle layer 254, as illustrated in FIG. 2F. In some embodiments, the patterned photoresist 264, or modified patterned photoresist 266 is removed after formation of the modified patterned middle layer 254.

The reactant can be any suitable reactant that can change the etch selectivity of the middle layer 250 relative to the bottom layer 240. In some embodiments, the reactant comprises an oxygen ($O_2$) inductively coupled plasma. In some embodiments, the reactant comprises an oxygen (O2) plasma generated by one or more of an inductively coupled plasma (ICP) source, a capacitively coupled plasma (CCP) source, a microwave plasma source or any energy source sufficient to generate plasma or radicals to active the reactant. In some embodiments, the middle layer 250 comprises a material that can be converted back and forth between non-oxygen rich and oxygen rich materials to have different selectivity than the photoresist or bottom layer.

At 160, after formation of the modified middle layer 254, the bottom layer 240 can be etched through the openings 256 in the modified middle layer 254, as shown in FIG. 2G. The pattern transfer illustrated in FIG. 2G forms a patterned bottom layer 242 with openings 244 and exposes portions of the substrate structure 204. The patterned bottom layer 242 is selectively etched over (relative to) the modified patterned middle layer 254. This process may also be referred to as bottom layer (BL) opening.

The bottom layer 240 can be made of any suitable material. In some embodiments, the bottom layer 240 comprises a material with one or more of good adhesion to the photoresist, good adhesion to the middle layer material, good adhesion to the underlying optional layer or hard mask, high modulus, amorphous or low stress. The bottom layer 240 of some embodiments comprises a diamond-like carbon material. In some embodiments, the diamond-like carbon material has high density (e.g., >1.8 g/cc), high modulus (e.g., >150 GPa) and low stress (e.g., <−500 MPa). In some embodiments, the diamond-like carbon material has a high sp3 carbon content. In one or more embodiments, the quantity/percentage of sp3 hybridized carbon atoms in the diamond-like carbon material is at least 40, 45, 50, 55, 60, 65, 70, 75, 80, or 85 percent of sp3 hybridized carbon atoms. In some embodiments, the diamond-like carbon material may contain from about 50 to about 90 percent of sp3 hybridized carbon atoms. The diamond-like carbon material may contain from about 60 to about 70 percent of sp3 hybridized carbon atoms. In some embodiments, the bottom layer 240 comprises a carbon film deposited by plasma enhanced chemical vapor deposition, plasma enhanced atomic layer deposition or a spin on carbon.

The bottom layer 240 can have any suitable thickness. In some embodiments, the bottom layer 240 has a thickness less than or equal to about 300 Å, 290 Å, 280 Å, 270 Å, 260 Å or 250 Å.

Selectively etching the bottom layer 240 to form the patterned bottom layer 242 can be done by any suitable process known to the skilled artisan. In some embodiments, the bottom layer 240 is selectively etched relative to the modified patterned middle layer 254 by an anisotropic etch process.

After selectively etching the bottom layer 240, the modified patterned middle layer 254 can be removed, as shown in FIG. 2H. In some embodiments, the etching the bottom layer 240 and removing the modified patterned middle layer 254 occur in substantially the same process.

The substrate structure 204 illustrated in the Figures comprises a dielectric layer 210 with a hard mask 220 formed thereon. The hard mask 220 has an optional layer 230 formed thereon. The optional layer 230 of some embodiments comprises or consists essentially of silicon oxide. The hard mask structure 208 is formed on the hard mask 220 or the optional layer 230.

In some embodiments, the optional layer 230 comprises or consists essentially of silicon dioxide and has a thickness less than or equal to about 200 Å, 190 Å, 180 Å, 170 Å or 160 Å.

In some embodiments, the hard mask comprises or consists essentially of one or more of titanium nitride or tungsten carbide, and the hard mask has a thickness less than or equal to about 200 Å, 190 Å, 180 Å, 170 Å or 160 Å.

In some embodiments, the dielectric layer 210 comprises a low-k dielectric. The dielectric layer 210 can have any suitable thickness. In some embodiments, the low-k dielectric comprises SiCOH.

Figure 2I:
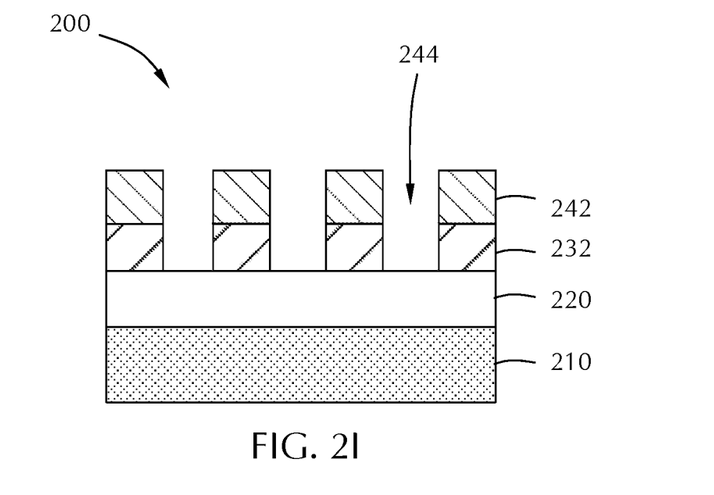
Figure 2J:
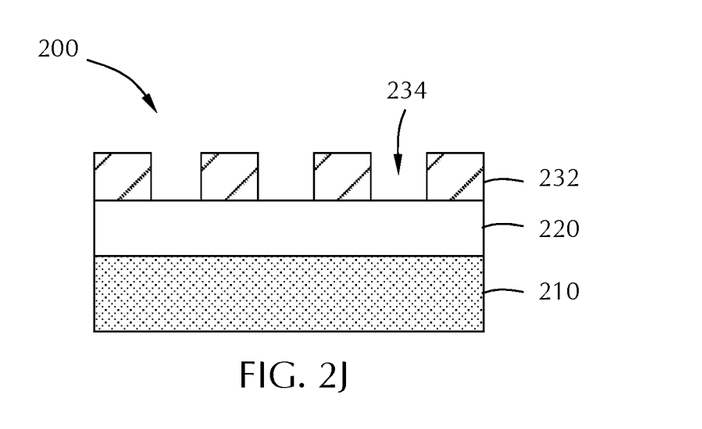

In FIG. 2I, the optional layer 230 is patterned to form patterned optional layer 232 with openings 234. After or during formation of the patterned optional layer 232, the patterned bottom layer 242 can be removed, as shown in FIG. 2J. The pattern transfer to the optional layer 230 and removal of the patterned bottom layer 242 do not have an enumerated process in method 100 of FIG. 1. If the optional layer 230 is present, this process would occur between 160 and 170.

Figure 2K:
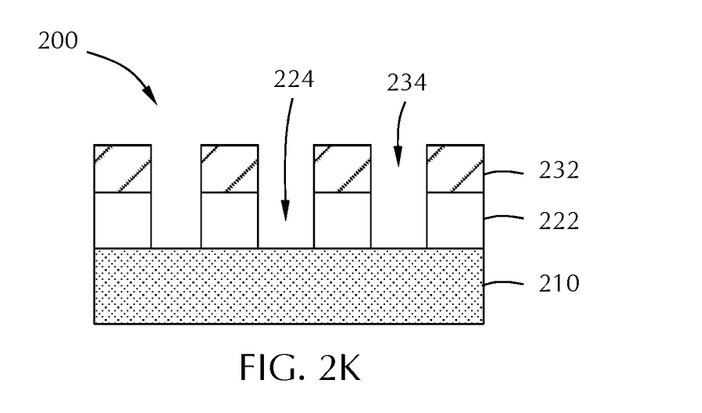
Figure 2L:
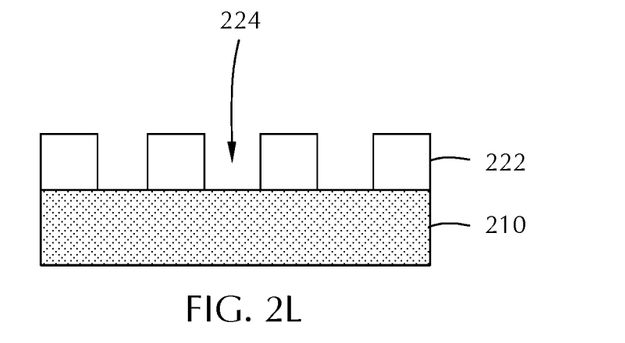

In FIG. 2K, and in method 100 at 170, the pattern can be transferred to the hard mask 220 to form patterned hard mask 222 and openings 224. During or after forming the patterned hard mask 222, the patterned optional layer 232 (or patterned bottom layer 242 if there is no optional layer 222) can be removed, as illustrated in FIG. 2L.

Figure 2M:
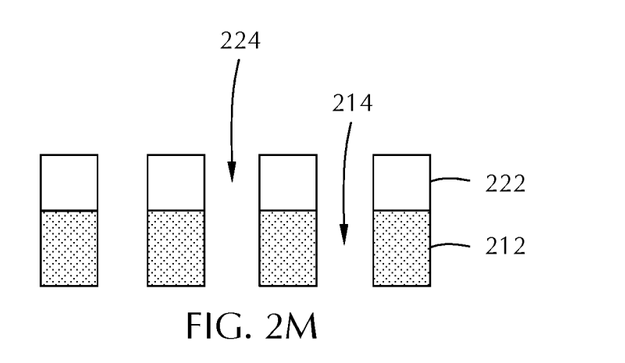
Figure 2N:
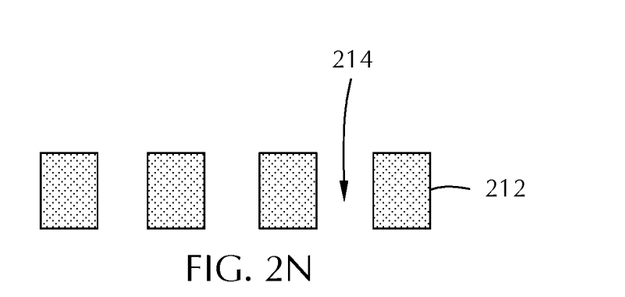

At 180 of method 100, the substrate or dielectric layer 210 can be patterned through openings 224 in patterned hard mask 222 to form a patterned dielectric layer 212, as shown in FIG. 2M. The pattern in the dielectric layer 212 appears as openings 214, trenches or vias, depending on the application. During or after forming the patterned dielectric layer 212, the patterned hard mask 222 can be removed by any suitable process, as illustrated in FIG. 2N.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of etching a substrate, the method comprising:
    etching a middle layer of a substrate through a patterned photoresist to form a patterned middle layer and expose portions of a bottom layer, the substrate comprising a film stack thereon, the film stack comprising the bottom layer on a hard mask, the middle layer on the bottom layer, and the patterned photoresist on the middle layer, wherein the middle layer comprises amorphous silicon and is etched selectively over the patterned photoresist;
    exposing the substrate to a reactant to convert the patterned middle layer to a modified patterned middle layer comprising silicon oxide; and
    etching the bottom layer through the modified patterned middle layer to form a patterned bottom layer and expose portions of the substrate, wherein the bottom layer is selectively etched over the modified patterned middle layer.

2. The method of claim 1, further comprising patterning a photoresist to form the patterned photoresist.

3. The method of claim 2, wherein patterning the photoresist comprises lithographically patterning the photoresist using EUV radiation to form openings in the photoresist with photoresist residue in the openings, and cleaning the photoresist of the residue.

4. The method of claim 3, wherein cleaning the residue from the photoresist comprises exposing the substrate to a plasma comprising one or more of HBr, oxygen gas ($O_2$), nitrogen gas ($N_2$) or hydrogen gas ($H_2$).

5. The method of claim 2, wherein the photoresist comprises an organic resist having a thickness less than or equal to about 280 Å.

6. The method of claim 2, wherein the photoresist comprises a metal oxide photoresist with a thickness less than or equal to about 130 Å.

7. The method of claim 1, wherein the bottom layer comprises a diamond-like carbon material, and the bottom layer has a thickness less than or equal to about 300 Å.

8. The method of claim 1, wherein the middle layer comprises amorphous silicon doped with boron.

9. The method of claim 8, wherein the middle layer comprises one or more of a bottom anti-reflective coating (BARC), dielectric anti-reflective coating (DARC), and the middle layer has a thickness less than or equal to about 200 Å.

10. The method of claim 1, wherein selectively etching the middle layer comprises exposing the substrate to a chlorine-based etchant.

11. The method of claim 1, wherein the reactant comprises an O2 inductively coupled plasma.

12. The method of claim 11, wherein the reactant removes the patterned photoresist at the same time as forming the modified patterned middle layer.

13. The method of claim 11, wherein modifying the patterned middle layer increases etch selectively relative to the bottom layer.

14. The method of claim 1, wherein the substrate comprises substrate structure, the substrate structure comprising a low-k dielectric having a hard mask formed thereon, the hard mask having an optional silicon dioxide layer formed thereon, and the film stack is formed on the hard mask or the optional silicon dioxide layer.

15. The method of claim 14, wherein the optional silicon dioxide layer has a thickness less than or equal to about 200 Å.

16. The method of claim 14, wherein the hard mask comprises one or more of titanium nitride or tungsten carbide, and the hard mask has a thickness less than or equal to about 200 Å.

17. The method of claim 16, further comprising:
removing the modified patterned middle layer;
etching the optional silicon dioxide layer through the patterned bottom layer to form a patterned optional silicon dioxide layer;
removing the patterned bottom layer;
etching the hard mask through the patterned optional silicon dioxide layer to form a patterned hard mask;
etching the low-k dielectric through the patterned hard mask to form a patterned substrate; and
removing the patterned hard mask.

18. An EUV patterning method comprising:
patterning a photoresist of a substrate using EUV radiation and a developer to form a patterned photoresist to expose portions of a middle layer and leave a residue of the photoresist, the substrate comprising a substrate structure and a hard mask structure, the substrate structure comprising a low-k dielectric with a metal hard mask formed thereon, the hard mask structure formed on the metal hard mask, wherein the hard mask structure comprises a bottom layer formed on the metal hard mask, the middle layer comprising amorphous silicon and formed on the bottom layer, and the photoresist formed on the middle layer, the bottom layer comprising a diamond-like carbon material;
removing the photoresist residue by exposing the substrate to a plasma comprising one or more of $O_2$, $N_2$, $H_2$ or HBr;
selectively etching the middle layer relative to the patterned photoresist to expose portions of the bottom layer and form a patterned middle layer;
removing the patterned photoresist;
exposing the patterned middle layer to an oxidizing agent to convert the patterned middle layer to a modified patterned middle layer comprising silicon oxide, the oxidizing agent comprising an inductively coupled $O_2$ plasma;
selectively etching the bottom layer relative to the modified patterned middle layer to expose portions of the metal hard mask and form a patterned bottom layer;
removing the modified patterned middle layer;
etching the metal hard mask relative to the patterned bottom layer to expose portions of the low-k dielectric and form a patterned hard mask;
removing the patterned bottom layer;
etching the low-k dielectric through the patterned hard mask; and
removing the patterned hard mask.

* * * * *